(12) United States Patent
Takaku et al.

(10) Patent No.: US 9,978,690 B2
(45) Date of Patent: May 22, 2018

(54) SEMICONDUCTOR APPARATUS AND MANUFACTURING METHOD FOR SAME

(71) Applicant: Toshiba Memory Corporation, Minato-ku (JP)

(72) Inventors: Satoru Takaku, Yokohama (JP); Chizuto Takatsuka, Yokohama (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days. days.

(21) Appl. No.: 14/916,864

(22) PCT Filed: Sep. 4, 2013

(86) PCT No.: PCT/JP2013/073755
§ 371 (c)(1),
(2) Date: Mar. 4, 2016

(87) PCT Pub. No.: WO2015/033396
PCT Pub. Date: Mar. 12, 2015

(65) Prior Publication Data
US 2016/0197045 A1    Jul. 7, 2016

(51) Int. Cl.
*H01L 23/552* (2006.01)
*H01L 23/16* (2006.01)
*H01L 23/31* (2006.01)

(52) U.S. Cl.
CPC ............ *H01L 23/552* (2013.01); *H01L 23/16* (2013.01); *H01L 23/3135* (2013.01);
(Continued)

(58) Field of Classification Search
CPC .............................. H01L 23/552; H01L 43/02
(Continued)

(56) References Cited

U.S. PATENT DOCUMENTS 5,561,265 A   10/1996  Livshits et al.
6,479,886 B1 * 11/2002  Pollock ................. H01L 23/552
                                                               257/659
(Continued)

FOREIGN PATENT DOCUMENTS

JP    2005-217221 A    8/2005
JP    2009-141194 A    6/2009
(Continued)

OTHER PUBLICATIONS

International Search Report dated Dec. 10, 2013 in PCT/JP2013/073755 filed on Sep. 4, 2013.
(Continued)

*Primary Examiner* — Shaun Campbell
*Assistant Examiner* — Warren H Kilpatrick
(74) *Attorney, Agent, or Firm* — Oblon, McClelland, Maier & Neustadt, L.L.P.

(57) ABSTRACT

A semiconductor device includes: a substrate on which a first contact portion is formed; a lower shield plate provided above the substrate to avoid the first contact portion and including a magnetic substance; a semiconductor chip provided above the lower shield plate and including a second contact portion electrically connected to the first contact portion, and a connection member that electrically connects the first contact portion and the second contact portion; and an upper shield plate provided above the semiconductor chip to avoid the second contact portion and the connection member and including a magnetic substance. An end of at least one of the lower shield plate and the upper shield plate is bent toward the other one of the lower shield plate and the upper shield plate so have a side wall portion whose tip is connected to the other one of the lower shield plate and the upper shield plate.

17 Claims, 16 Drawing Sheets

(a)

(b)

(52) U.S. Cl.
CPC ............... *H01L 2224/48091* (2013.01); *H01L 2224/49175* (2013.01); *H01L 2224/73265* (2013.01); *H01L 2924/181* (2013.01)

(58) Field of Classification Search
USPC ................................................ 257/659, 422
See application file for complete search history.

(56) References Cited

U.S. PATENT DOCUMENTS

| | | | | |
|---|---|---|---|---|
| 7,629,674 | B1* | 12/2009 | Foster | ..................... H01L 21/56 |
| | | | | 257/659 |
| 9,172,028 | B2 | 10/2015 | Watanabe et al. | |
| 2002/0089832 | A1 | 7/2002 | Huang | |
| 2003/0067757 | A1 | 4/2003 | Richardson et al. | |
| 2013/0256819 | A1* | 10/2013 | Watanabe | ............... H01L 43/02 |
| | | | | 257/422 |

FOREIGN PATENT DOCUMENTS

| | | |
|---|---|---|
| JP | 2010-123666 A | 6/2010 |
| JP | 2011-114225 A | 6/2011 |
| JP | 2013-207059 A | 10/2013 |

OTHER PUBLICATIONS

Taiwanese Office Action dated Jun. 10, 2015 in Patent Application No. 102132475 (with English language translation).
International Preliminary Report of Patentability and Written Opinion dated Mar. 17, 2016 in PCT/JP2013/073755 (with English translation).

* cited by examiner (a)            (b)

(a)　　　　　　　　　　(b)

(a)　　　　　　　　　　　(b)

(a)   (b)

(a)　　　　　　　　　　　(b)

(a)    (b)

(a)    (b)

(a)　　　　　　　　(b)

(a)            (b)

(a)   (b)

(a)  (b)

(a)　　　　　　　　　　(b)

SEMICONDUCTOR APPARATUS AND MANUFACTURING METHOD FOR SAME

TECHNICAL FIELD

The embodiments described herein relate to a semiconductor device and a method for producing the same.

BACKGROUND ART

Some semiconductor devices are susceptible to an external magnetic field. Such semiconductor devices that are susceptible to a magnetic field can be suitably operated by reducing the influence of an external magnetic field by using a magnetic shield. An example of a known magnetic shield used for a semiconductor device is an electromagnetic wave absorption mold resin that contains a high-magnetic-permeability material as a filler and that covers an upper surface and a side surface of a semiconductor chip so as to reduce the influence of an external magnetic field on the semiconductor device.

CITATION LIST

Patent Literature

Patent Literature 1: JP 2005-217221 A

SUMMARY OF INVENTION

Problem to be Solved by the Invention

The embodiments described herein provide a semiconductor device that has an enhanced magnetic shield effect, and a method for producing the same.

Means for Solving the Problem

A semiconductor device according to the embodiments includes a substrate on which a first contact portion is formed, and a lower shield plate that is provided above the substrate so as to avoid the first contact portion and includes a magnetic substance. Furthermore, the semiconductor device includes a semiconductor chip that is provided above the lower shield plate and has a second contact portion electrically connected to the first contact portion, and a connection member that electrically connects the first contact portion and the second contact portion. Furthermore, the semiconductor device includes an upper shield plate that is provided above the semiconductor chip so as to avoid the second contact portion and the connection member and includes a magnetic substance. An end of at least one of the lower shield plate and the upper shield plate is bent toward the other one of the lower shield plate and the upper shield plate so as to have a side wall portion whose tip is connected to the other one of the lower shield plate and the upper shield plate.

DESCRIPTION OF EMBODIMENTS

Embodiments of a semiconductor storage device are described below with reference to the drawings.

Configuration of Semiconductor Device According to First Embodiment

Figure 1:
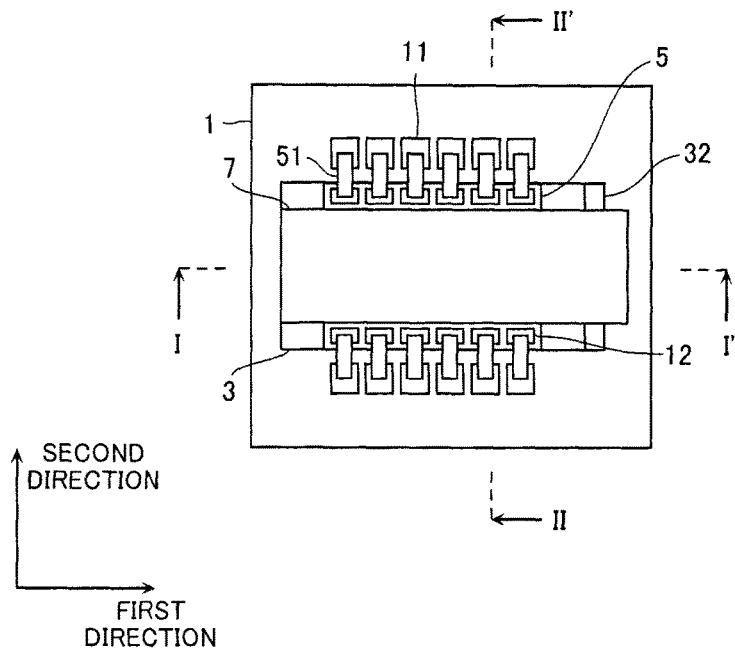
FIG. 1 is a plan view schematically illustrating a semiconductor device according to first embodiment.
Figure 2:
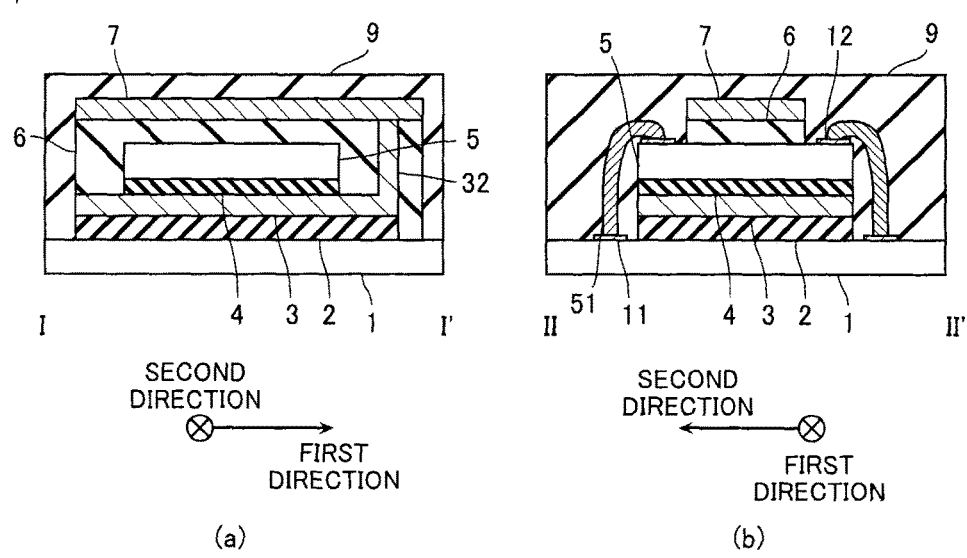
FIG. 2 is side views schematically illustrating the semiconductor device.

First, a configuration of a semiconductor device according to first embodiment is described with reference to FIGS. 1 and 2. FIG. 1 is a plan view schematically illustrating a semiconductor device according to first embodiment. FIG. 2(a) is a cross-sectional view taken along the line I-I' in FIG. 1, and FIG. 2(b) is a cross-sectional view taken along the line II-II' in FIG. 1.

As illustrated in FIGS. 1 and 2, the semiconductor device according to the present embodiment includes a substrate 1, a lower shield plate 3 attached onto the substrate 1 with an insulating first adhesive 2 sandwiched therebetween, a semiconductor chip 5 mounted on the lower shield plate 3 with an insulating second adhesive 4 sandwiched therebetween, a first insulating resin 6 that covers an upper surface and some side surfaces of the semiconductor chip 5, and an upper shield plate 7 attached onto an upper surface of the first insulating resin 6. The lower shield plate 3 has a side wall portion 32 extending in a direction in which these members are stacked, and the side wall portion 32 is in contact with a lower surface of the upper shield plate 7. These members are embedded in a second insulating resin 9. In FIG. 1, the illustration omits the second insulating resin 9 for explanation.

In the present embodiment, insulating materials such as ceramics, a resin, or silicon (Si) whose surface has been oxidized is used as the substrate 1. Wires (not illustrated) and contact portions 11 (first contact portions) that are connected to the wires are provided on a surface of the substrate 1. The wires and the contact portions 11 are formed by printing, vapor deposition, or another method by using a metal such as copper. The contact portions 11 are bonding pads connected to the semiconductor chip 5 and are aligned at predetermined intervals along both side surfaces of the lower shield plate 3 in a direction (hereinafter referred to as a "first direction") in which the lower shield plate 3 extends.

The lower shield plate 3 is a rectangle whose longitudinal direction is the first direction, and the first adhesive 2 is attached onto a lower surface thereof. The length of the lower shield plate 3 in the first direction is longer than that of the semiconductor chip 5 in the first direction. The width of the lower shield plate 3 in a direction (hereinafter referred to as a "second direction") orthogonal to the first direction is smaller than an interval between the contact portions 11 in the second direction and is almost the same as the width of the semiconductor chip 5 in the second direction. A high-magnetic-permeability material is used as the lower shield plate 3. In the present embodiment, a magnetic alloy containing iron such as PC permalloy (Ni—Mo, Cu—Fe) is used. Note that in the present embodiment, the thickness of the lower shield plate 3 is approximately from 50 µm to 150 µm.

In the present embodiment, the lower shield plate 3 has the side wall portion 32. In the present embodiment, the side wall portion 32 is formed by bending a plate made of a magnetic alloy. Accordingly, in the present embodiment, the thickness of the lower shield plate 3 is almost the same as that of the side wall portion 32.

The semiconductor chip 5 includes an integrated circuit. In the present embodiment, a storage device in which a plurality of data are magnetically stored is mounted as the semiconductor chip 5. The storage device may be, for example, one in which data is written by spin injection and the written data is discriminated on the basis of a change of resistance caused by a tunnel magneto resistance effect. Note that a different storage device may be mounted as the semiconductor chip 5 or a configuration other than a storage device may be mounted as the semiconductor chip 5.

The second adhesive 4 is attached onto a lower surface of the semiconductor chip 5, and contact portions 12 (second contact portions) are provided on an upper surface of the semiconductor chip 5 on both sides in the second direction. The contact portions 12 are electrically connected to the contact portions 11 via bonding wires 51 that are a plurality of connection members.

The upper shield plate 7 is a rectangle whose longitudinal direction is the first direction, and the first insulating resin 6 is attached onto a lower surface thereof. The width of the upper shield plate 7 in the second direction is smaller than that of the contact portions 12 in the second direction. The length of the upper shield plate 7 in the first direction is almost the same as that of the lower shield plate 3 in the first direction. A high-magnetic-permeability material is used as the upper shield plate 7 as with the lower shield plate 3. In the present embodiment, a magnetic alloy containing iron such as PC permalloy (Ni—Mo, Cu—Fe) is used. In the present embodiment, the thickness of the upper shield plate 7 is approximately from 50 µm to 150 µm.

The upper shield plate 7 is in contact with the lower shield plate via the side wall portion 32. Accordingly, the upper shield plate 7 forms a magnetic shield that protects the semiconductor device 5 from an external magnetic field together with the lower shield plate 3.

In the semiconductor device according to the present embodiment, the lower surface of the semiconductor chip 5 is covered with the lower shield plate 3, the upper surface of the semiconductor chip 5 is covered with the upper shield plate 7, and the side surface of the semiconductor chip 5 is covered with the side wall portion 32. Furthermore, the width of the lower shield plate 3 in the second direction is almost the same as that of the semiconductor chip 5 in the second direction, and although the width of the upper shield plate 7 in the second direction is slightly smaller than that of the semiconductor chip 5 in the second direction, a main portion of the semiconductor chip 5 is suitably protected from an external magnetic field. The width of the lower shield plate 3 and the width of the upper shield plate 7 are set to ones that can prevent the lower shield plate 3 and the upper shield plate 7 from making contact with the bonding wires 51 drawn out from the semiconductor chip 5 and the contact portions 11 and 12. With the arrangement, the lower surface of the semiconductor device 5 can also be protected from an external magnetic field, thereby allowing the semiconductor device according to the present embodiment to operate well. Note that the width of the lower shield plate 3 in the second direction may be almost the same as that of the upper shield plate 7 in the second direction, as long as a main portion of the semiconductor chip 5 is protected.

Method for Producing Semiconductor Device According to First Embodiment

Figure 3:
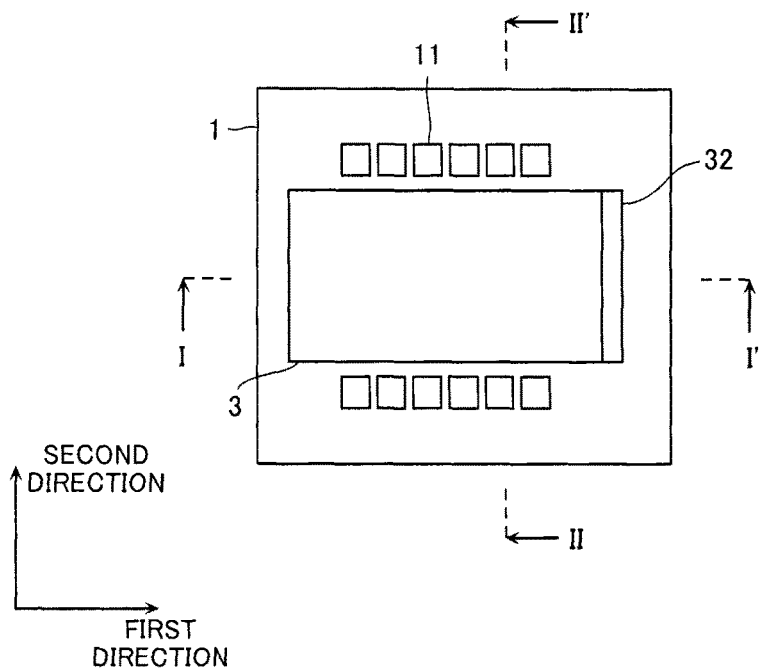
FIG. 3 is a plan view schematically illustrating a method for producing the semiconductor device.
Figure 7:
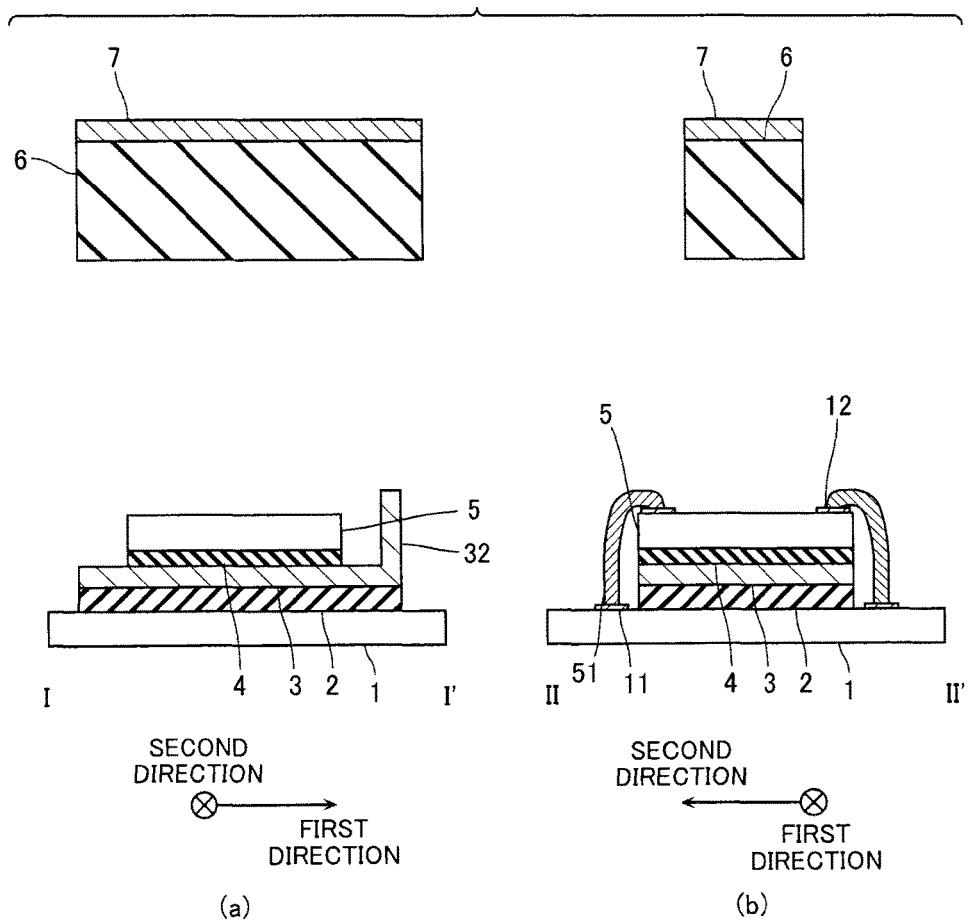
FIG. 7 is side views schematically illustrating a method for producing the semiconductor device.
Figure 8:
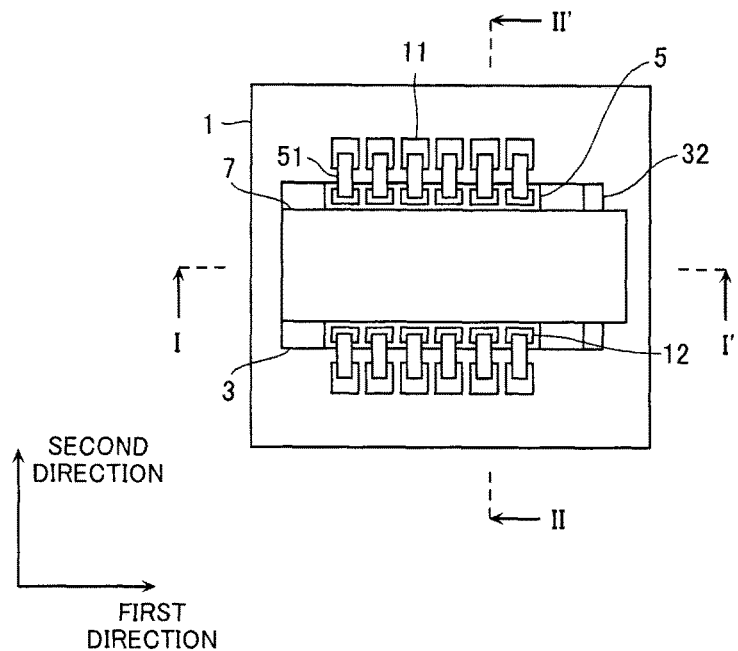
FIG. 8 is a plan view schematically illustrating a method for producing the semiconductor device.

Next, a method for producing the semiconductor device according to the present embodiment is described. FIGS. 3, 5, and 8 are plan views schematically illustrating a method for producing the semiconductor device according to the present embodiment, FIGS. 4(a), 6(a), and 9(a) are cross-sectional views taken along the line I-I' in FIGS. 3, 5, and 8, respectively, and FIGS. 4(b), 6(b), and 9(b) are cross-sectional views taken along the line II-II' in FIGS. 3, 5, and 8, respectively. FIG. 7 is cross-sectional views illustrating the method for producing the semiconductor device according to the present embodiment.

Figure 4:
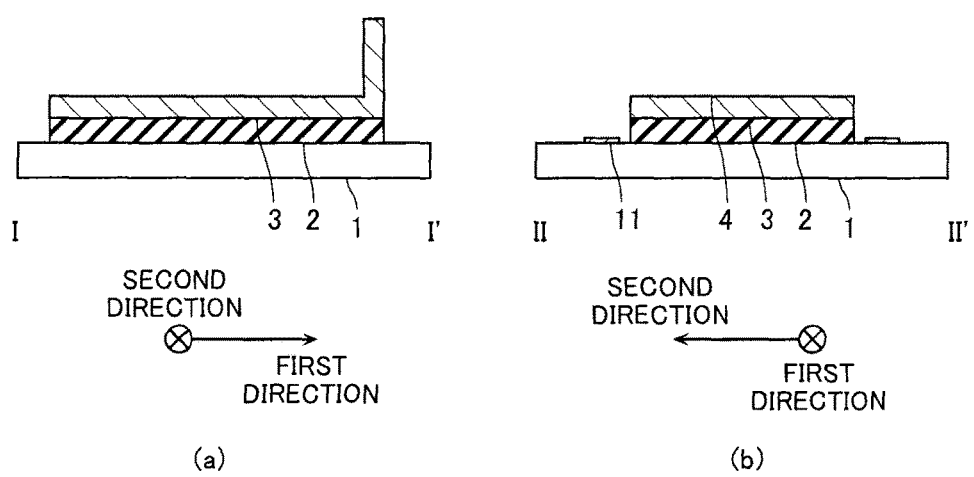
FIG. 4 is side views schematically illustrating a method for producing the semiconductor device.
Figure 5:
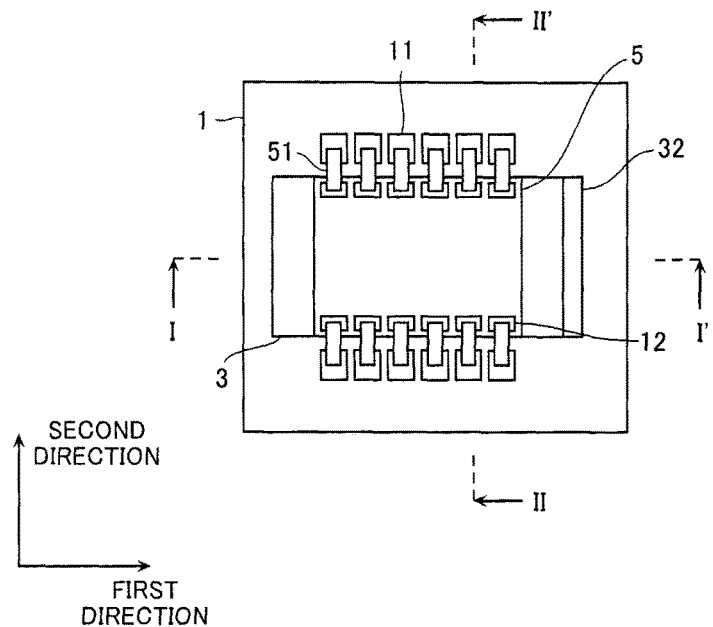
FIG. 5 is a plan view schematically illustrating a method for producing the semiconductor device.

In the method for producing the semiconductor device according to the present embodiment, first, the substrate 1 on which the wires (not illustrated) and the contact portions 11 are provided is prepared as illustrated in FIGS. 3 and 4. The substrate 1 is a rectangle whose longitudinal direction is the first direction and whose width direction is the second direction. The contact portions 11 are provided along the longitudinal direction so that a predetermined space is formed in the width direction. The lower shield plate 3 extending in the first direction is placed in two spaces formed between the contact portions 11 of the substrate 1 in the width direction and are then adhered by using the first adhesive 2.

In the present embodiment, the lower shield plate 3 is placed on the substrate 1 in a state where the first adhesive 2 is attached or applied onto a rear surface of the lower shield plate 3. However, for example, the first adhesive 2 may be applied to the substrate 1 side.

Figure 6:
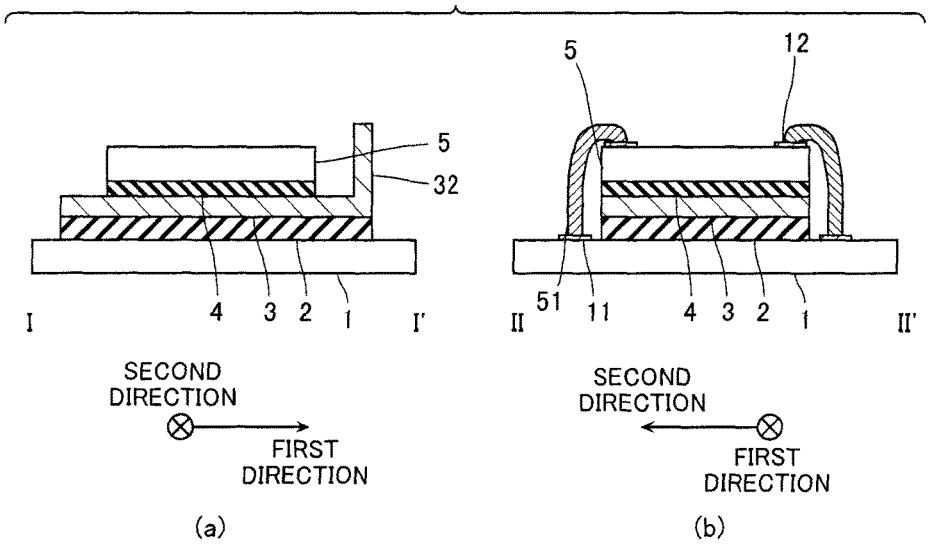
FIG. 6 is side views schematically illustrating a method for producing the semiconductor device.

Next, as illustrated in FIGS. 5 and 6, the semiconductor chip 5 is mounted on the lower shield plate 3. The semiconductor chip 5 is placed on the lower shield plate 3 so that the contact portions 12 provided on the upper surface of the semiconductor chip 5 correspond to the contact portions 11 provided on the substrate 1. In the present embodiment, the second adhesive 4 is attached or applied onto the lower surface of the semiconductor chip 5, and then semiconductor chip 5 is placed on the lower shield plate 3. However, for example, the semiconductor chip 5 may be placed on the lower shield plate 3 onto which the second adhesive 4 has been attached or applied.

Next, the contact portions 12 of the semiconductor chip 5 and the contact portions 11 of the substrate 1 are electrically connected to each other via the bonding wires 51. In the present embodiment, the width of the semiconductor chip 5 in the second direction is almost the same as that of the lower shield plate 3 in the second direction. This makes it possible to prevent contact between the bonding wires 51 drawn out from the semiconductor chip 5 and the lower shield plate 3.

Next, as illustrated in FIG. 7, the first insulating resin 6 that has a predetermined thickness and includes a thermosetting resin is formed on one surface of the upper shield plate 7. In the present embodiment, a thermosetting acrylic resin is used as the first insulating resin 6, but various materials having plasticity such as ultraviolet curable resin can be used.

Figure 9:
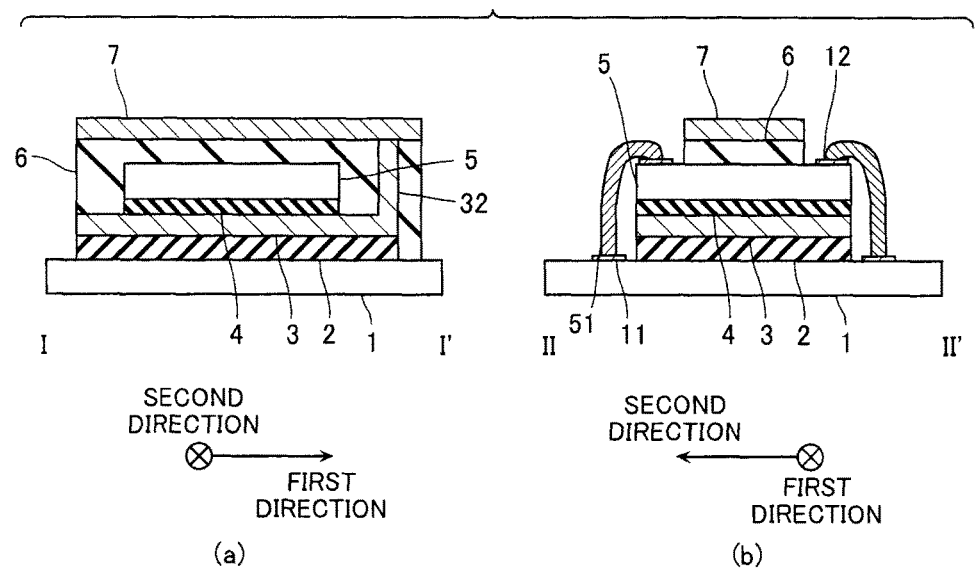
FIG. 9 is side views schematically illustrating a method for producing the semiconductor device.

Next, as illustrated in FIGS. 8 and 9, the upper shield plate 7 is pressed against the semiconductor device 5 so that the surface on which the first insulating resin 6 is formed faces the semiconductor device 5 and so that the upper shield plate 7 avoids the contact portions 12 and the bonding wires 51. The lower shield plate 3 and the upper shield plate 7 are made in contact with each other via the side wall portion 32 extending from the lower shield plate 3 to the upper shield plate 7. In this step, the upper shield plate 7 is placed in a space between the contact portions 12 on the upper surface of the semiconductor chip 5. As a result of this step, the upper surface of the lower shield plate 3, both side surfaces of the side wall portion 32, and the semiconductor chip 5 are embedded in the first insulating resin 6.

The first insulating resin 6 is within a region directly below the upper shield plate 7 in FIGS. 9(a) and 9(b), but it is estimated that actually, the first insulating resin 6 is pushed out from side surfaces of the upper shield plate 7 and expands onto the upper surface of the semiconductor chip 5 and the like. In view of this, it is possible that the thickness of the first insulating resin 6 be set equal to or smaller than a distance between the upper surface of the lower shield plate 3 and an upper end of the side wall portion 32. Furthermore, it is possible that part of the first insulating resin 6 that has expanded be removed, and it is possible that a difference in height be created in advance between a portion that makes contact with the upper surface of the semiconductor chip 5 and a portion that makes contact with the upper surface of the lower shield plate 3.

Next, the first insulating resin 6 is cured by heat or the like. Furthermore, all of these members are embedded in the second insulating resin 9. As a result, the semiconductor device according to the present embodiment is produced as illustrated in FIGS. 1 and 2.

In the present embodiment, the width of the upper shield plate 7 in the second direction is smaller than that of the semiconductor device 5 in the second direction and that of the lower shield plate 3 in the second direction. This makes it possible to suitably prevent contact between the bonding wires 51 and the upper shield plate 7.

According to the method for producing the semiconductor device according to the present embodiment, the upper shield plate 7 having, on the rear surface thereof, the first insulating resin 6 that has a predetermined thickness and is made of a thermosetting resin is pressed against the semiconductor chip 5, so that the rear surface faces the semiconductor chip 5, and the lower shield plate 3 and the upper shield plate 7 are made in contact with each other via the side wall portion 32 extending from the lower shield plate 3 to the upper shield plate 7. Therefore, it is considered that the upper shield plate 7 and the lower shield plate 3 can be made in contact with each other better than, for example, in a case where the upper shield plate 7 having an adhesive layer formed on the rear surface thereof is adhered to the side wall portion 32 of the lower shield plate 3.

Furthermore, in this step, the upper surface of the lower shield plate 3, both side surfaces of the side wall portion 32, and the semiconductor chip 5 are embedded in the first insulating resin 6. Accordingly, it is considered that filling of a resin is easier than, for example, in a case where the upper surface of the lower shield plate 3, both side surfaces of the side wall portion 32, and the semiconductor chip 5 are embedded after the upper shield plate 7 is adhered to the side wall portion 32 and the semiconductor chip 5. Furthermore, the number of steps can be reduced as compared with such a method.

Furthermore, in the present embodiment, the lower shield plate 3 has the side wall portion 32, and the upper shield plate 7 has no side wall portion. Accordingly, the first insulating resin 6 can be easily formed on the lower surface of the upper shield plate 7. However, for example, the upper shield plate 7 may have a side wall portion, or both of the lower shield plate 3 and the upper shield plate 7 may have a side wall portion. Furthermore, for example, it is possible that a contact area between the lower shield plate 3 and the upper shield plate 7 be increased by bending the upper end of the side wall portion 32.

Semiconductor Device According to Second Embodiment

Figure 10:
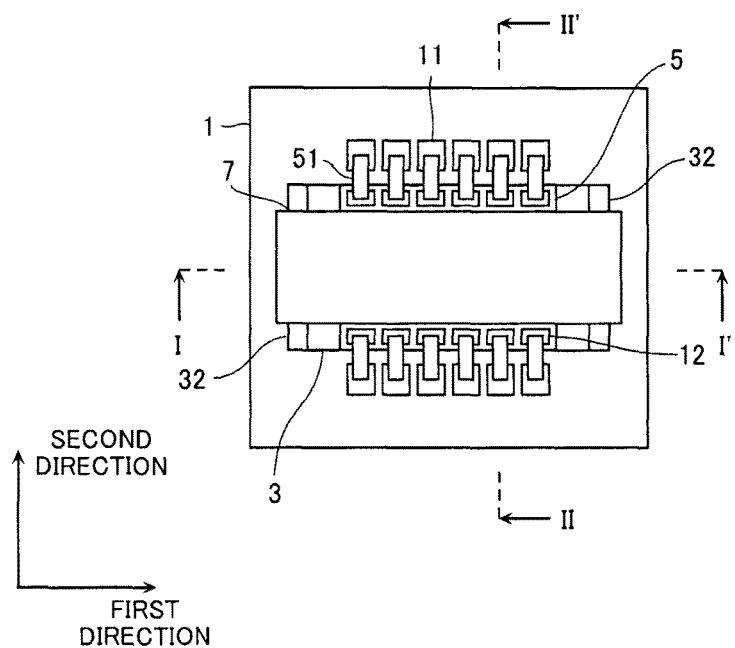
FIG. 10 is a plan view schematically illustrating a semiconductor device according to second embodiment.

Next, a configuration of a semiconductor device according to second embodiment is described. FIG. 10 is a plan view schematically illustrating the semiconductor device according to first embodiment. FIG. 11(a) is a cross-sectional view taken along the line I-I' in FIG. 10, and FIG. 11(b) is a cross-sectional view taken along the line II-II' in FIG. 10.

Figure 11:
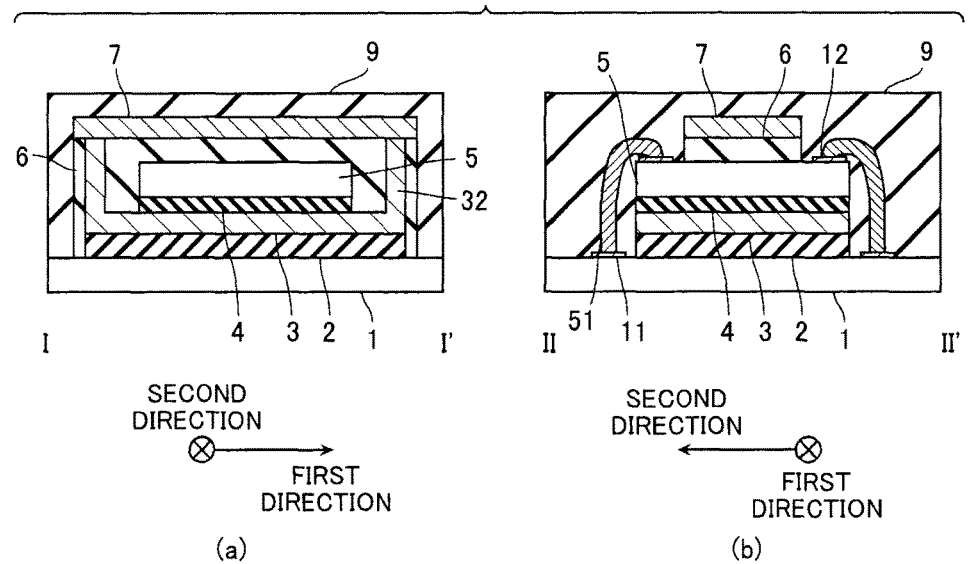
FIG. 11 is side views schematically illustrating the semiconductor device.

The semiconductor device according to second embodiment has a configuration that is basically almost the same as the semiconductor device according to first embodiment. However, the semiconductor device according to second embodiment is different from the semiconductor device according to first embodiment in that both ends of a lower shield plate 3 in the first direction are bent as illustrated in FIGS. 10 and 11. In other words, in the present embodiment, the lower shield plate 3 has two side wall portions 32. These side wall portions 32 are in contact with a lower surface of the upper shield plate 7.

In the present embodiment, the lower shield plate 3 and the upper shield plate 7 function as a box-shaped magnetic shield that has no wall on sides facing each other (sides from which the bonding wires 51 are drawn out). In the semiconductor device according to the present embodiment, more pathways through which a magnetic field received by the lower shield plate 3 is transmitted to the upper shield plate 7 or a magnetic field received by the upper shield plate 7 is transmitted to the lower shield plate 3 are provided. This can make shielding performance higher than that in the semiconductor device according to first embodiment.

Although the lower shield plate 3 has the two side wall portions 32 in the present embodiment, it is possible that the upper shield plate 7 have two side wall portions or it is, for example, possible that the lower shield plate 3 have a single side wall portion and the upper shield plate 7 have a single side wall portion.

Figure 12:
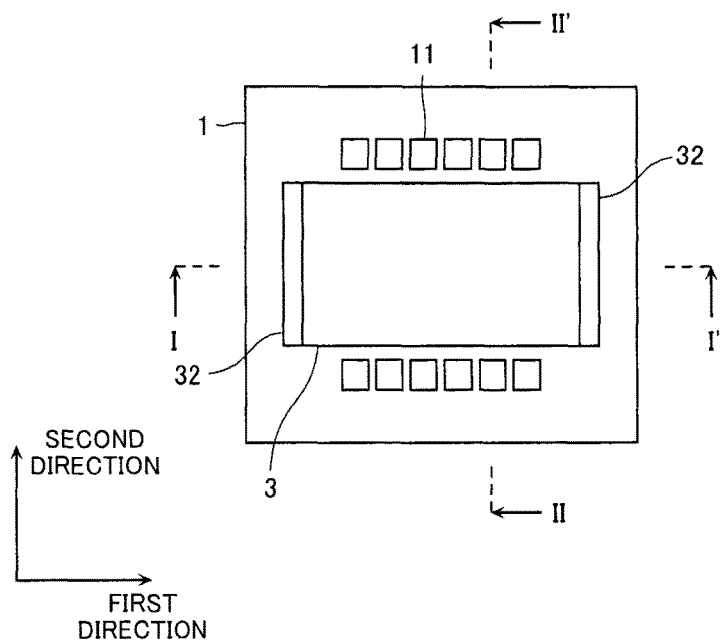
FIG. 12 is a plan view schematically illustrating a method for producing the semiconductor device.
Figure 16:
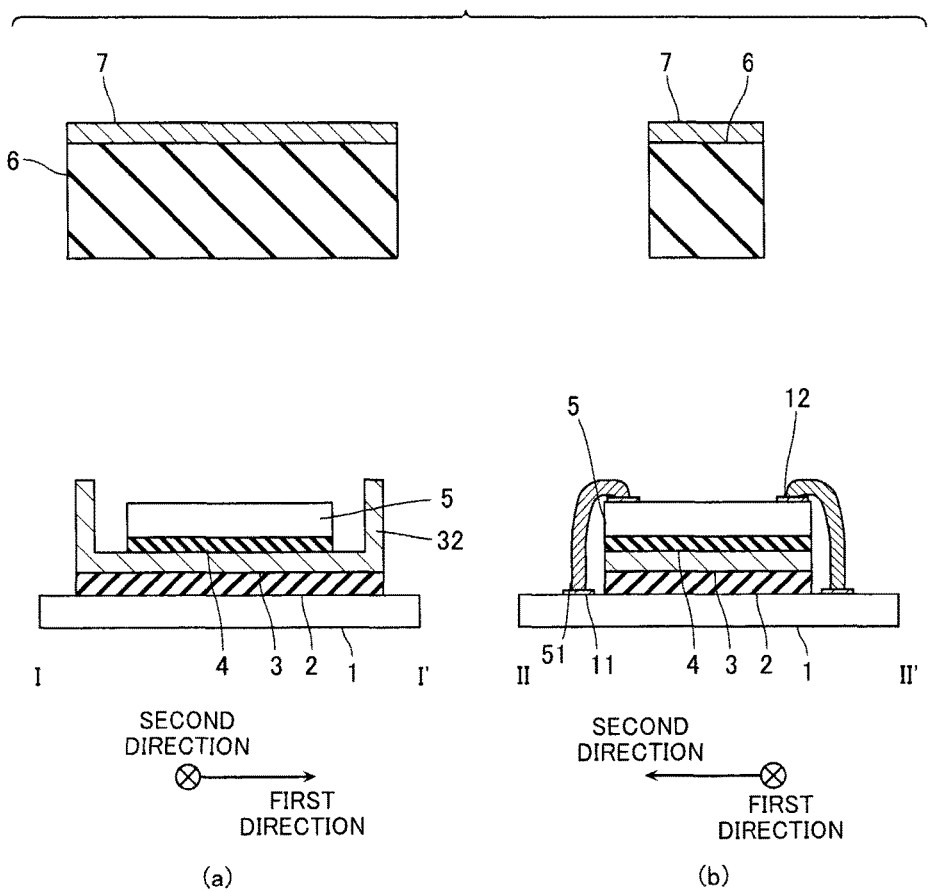
FIG. 16 is side views schematically illustrating a method for producing the semiconductor device.
Figure 17:
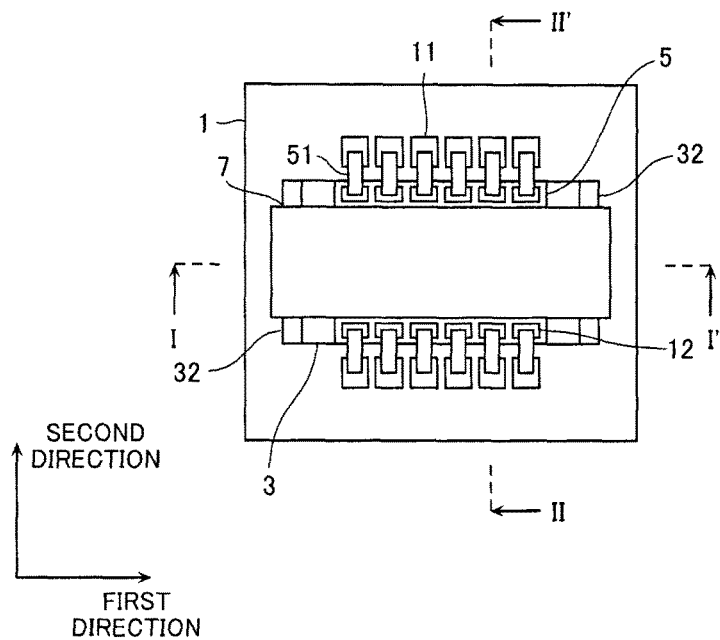
FIG. 17 is a plan view schematically illustrating a method for producing the semiconductor device.

Next, a method for producing the semiconductor device according to second embodiment is described. FIGS. 12, 14, and 17 are plan views schematically illustrating a method for producing the semiconductor device according to the present embodiment, FIGS. 13(a), 15(a), and 18(a) are cross-sectional views taken along the line I-I' in FIGS. 12, 14, and 17, respectively, and FIGS. 13(b), 15(b), and 18(b) are cross-sectional views taken along the line II-II' in FIGS. 12, 14, and 17, respectively. FIG. 16 is cross-sectional views illustrating the method for producing the semiconductor device according to the present embodiment.

Figure 13:
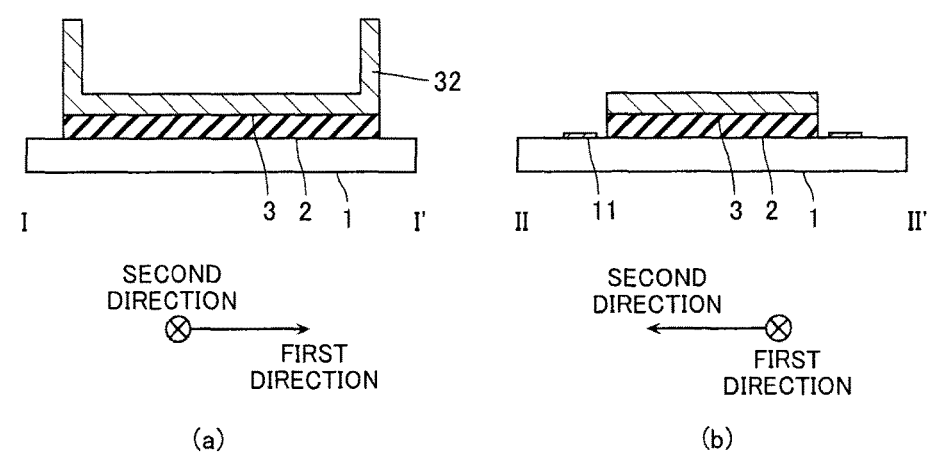
FIG. 13 is side views schematically illustrating a method for producing the semiconductor device.
Figure 14:
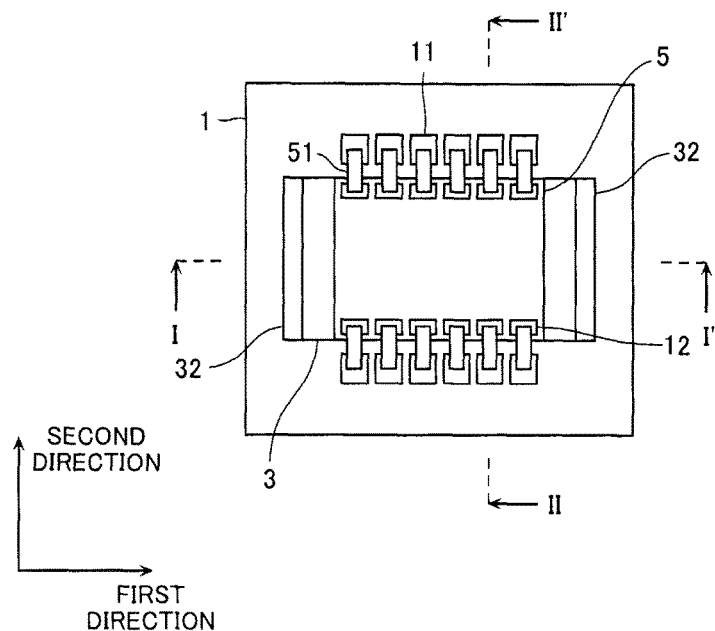
FIG. 14 is a plan view schematically illustrating a method for producing the semiconductor device.

In the method for producing the semiconductor device according to the present embodiment, the lower shield plate 3 is placed on the substrate 1 and is then adhered by using a first adhesive 2 as in first embodiment as illustrated in FIGS. 12 and 13. The lower shield plate 3 according to the present embodiment is basically similar to the lower shield plate 3 according to first embodiment, but is different from the lower shield plate 3 according to first embodiment in that the lower shield plate 3 has two side wall portions 32.

Figure 15:
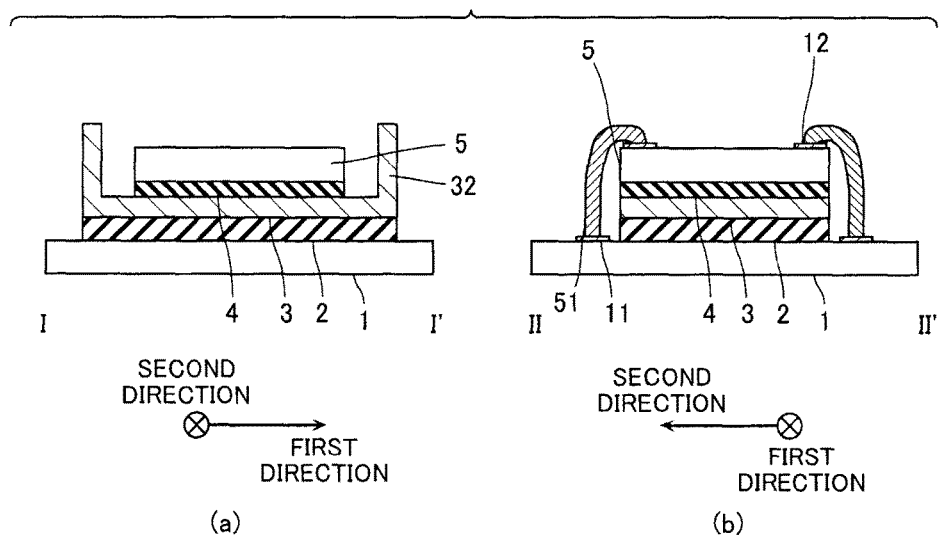
FIG. 15 is side views schematically illustrating a method for producing the semiconductor device.

Next, as illustrated in FIGS. 14 and 15, a semiconductor chip 5 is mounted on the lower shield plate 3 as in first embodiment. Next, contact portions 12 of the semiconductor chip 5 and contact portions 11 of the substrate 1 are electrically connected via the bonding wires 51 as in first embodiment. This makes it possible to prevent contact between the bonding wires 51 drawn out from the semiconductor chip 5 and the lower shield plate 3 as in first embodiment.

Figure 18:
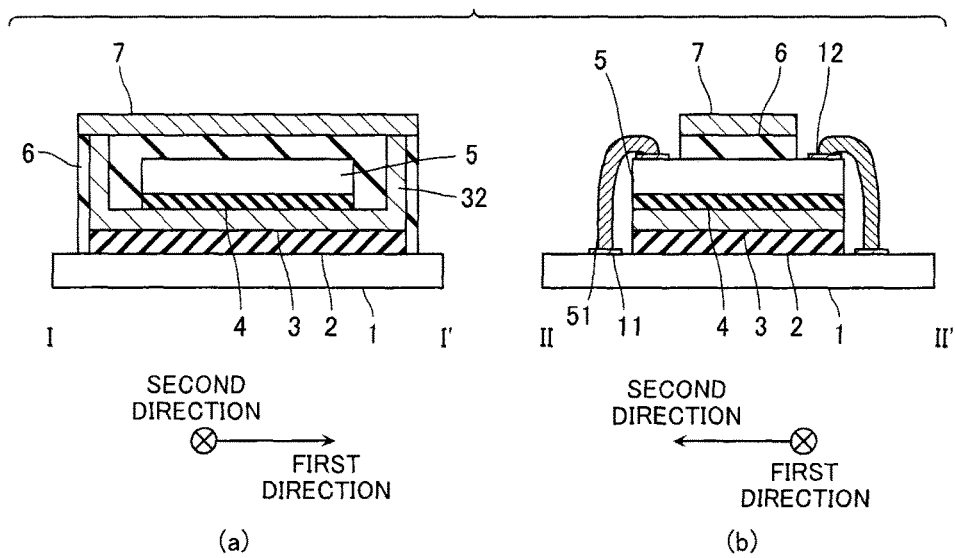
FIG. 18 is side views schematically illustrating a method for producing the semiconductor device.

Next, as illustrated in FIG. 16, a first insulating resin 6 is formed on one surface of the upper shield plate 7 as in first embodiment. Next, as illustrated in FIGS. 17 and 18, the upper shield plate 7 is pressed against the semiconductor device 5, and the lower shield plate 3 and the upper shield plate 7 are made in contact with each other via the side wall portions 32 extending from the lower shield plate 3 to the upper shield plate 7 as in first embodiment.

Next, the first insulating resin 6 is cured by heat or the like, and all the members are embedded in a second insulating resin 9 as in first embodiment. As a result of the above steps, the semiconductor device according to the present embodiment is produced as illustrated in FIGS. 10 and 11.

In the present embodiment, the lower shield plate 3 has two side wall portions 32. Accordingly, even if one of the side wall portions 32 is not in contact with the upper shield plate 7, it is considered that the other one of the side wall portions 32 can be made in contact with the upper shield plate 7. It is therefore possible to improve yield of magnetic shields.

Semiconductor Device According to Third Embodiment

Figure 19:
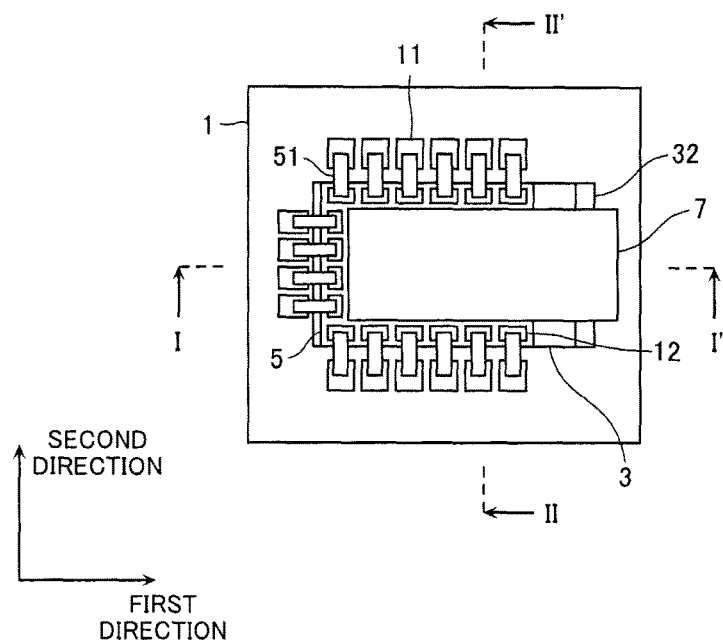
FIG. 19 is a side view schematically illustrating a semiconductor device according to third embodiment.

Next, a configuration of a semiconductor device according to third embodiment is described. FIG. 19 is a plan view schematically illustrating a semiconductor device according to first embodiment. FIG. 20(a) is a cross-sectional view taken along the line I-I' in FIG. 19, and FIG. 20(b) is a cross-sectional view taken along the line II-II' in FIG. 19.

The semiconductor device according to third embodiment has a configuration that is basically almost the same as the semiconductor device according to first embodiment. However, the semiconductor device according to the present embodiment is different from the semiconductor device according to first embodiment in that contact portions 11 are also provided in a portion of the substrate 1 that is exposed from the lower shield plate 3 in the first direction, and bonding wires 51 are also drawn out from a semiconductor chip 5 in the first direction and are connected to the contact portions 11 provided in the exposed portion. In the semiconductor device according to the present embodiment, even if the number of bonding wires 51 drawn out from the semiconductor chip 5 increases to a certain number or more, contact can be easily made.

Figure 21:
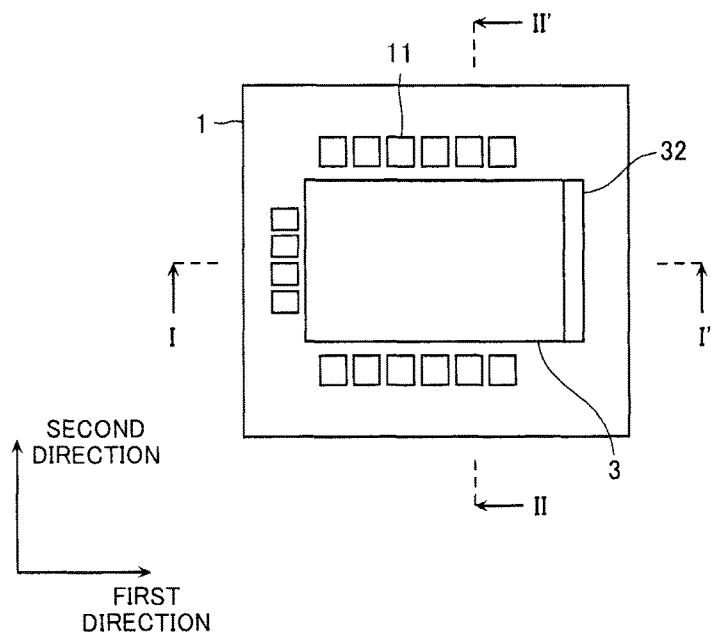
FIG. 21 is a plan view schematically illustrating a method for producing the semiconductor device.
Figure 25:
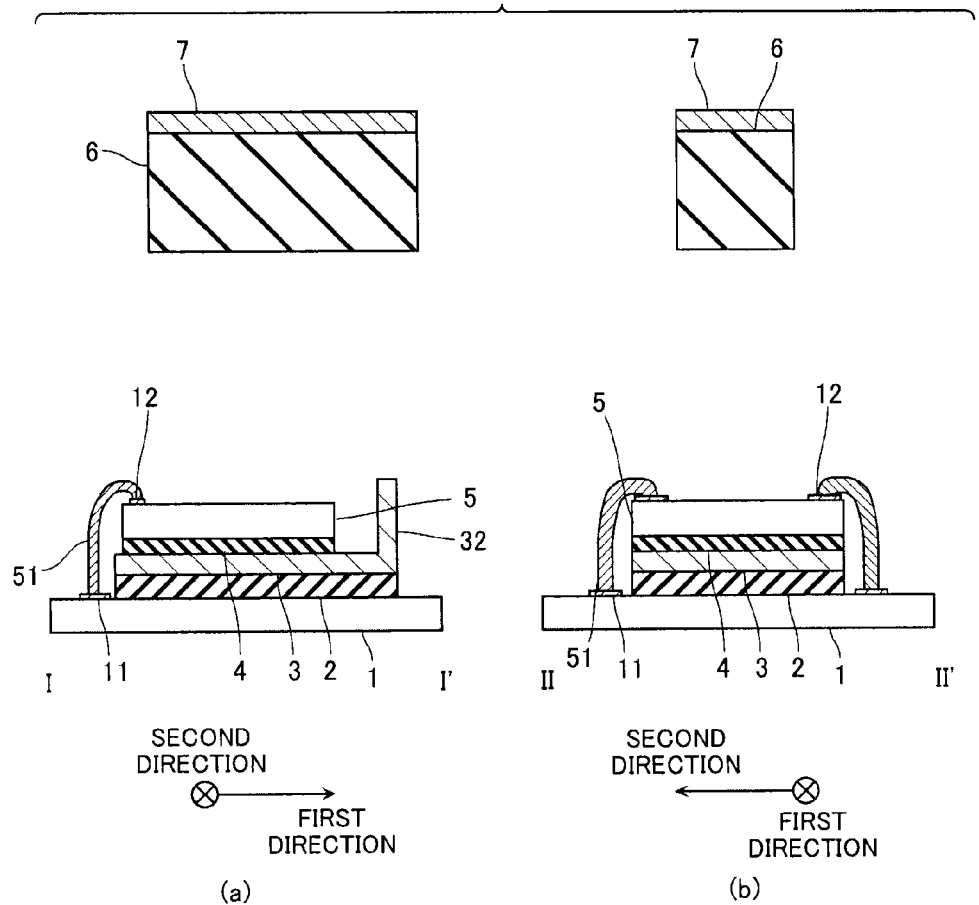
FIG. 25 is side views schematically illustrating a method for producing the semiconductor device.
Figure 26:
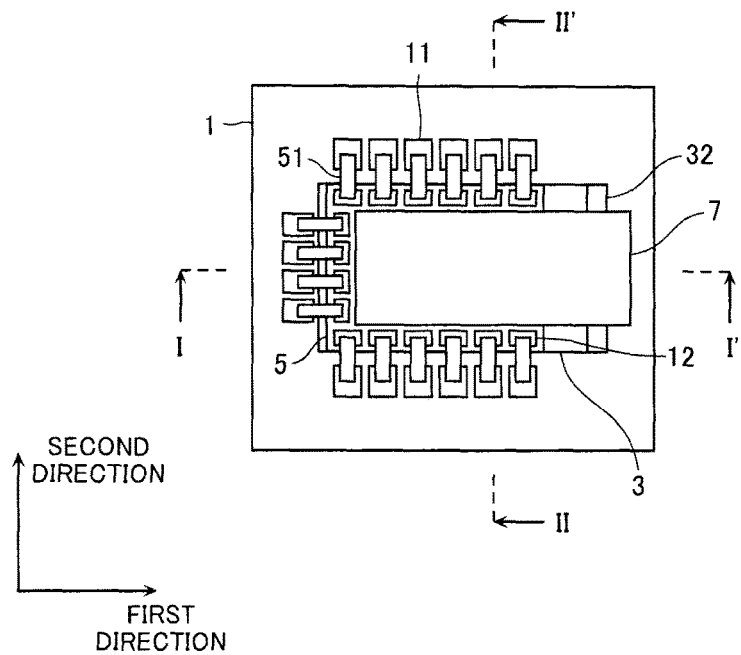
FIG. 26 is a plan view schematically illustrating a method for producing the semiconductor device.

Next, a method for producing the semiconductor device according to third embodiment is described. FIGS. 21, 23, and 26 are plan views schematically illustrating a method for producing the semiconductor device according to the present embodiment, FIGS. 22(a), 24(a), and 27(a) are cross-sectional views taken along the line I-I' in FIGS. 21, 23, and 26, respectively, and FIGS. 22(b), 24(b), and 27(b) are cross-sectional views taken along the line II-II' in FIGS. 21, 23, and 26, respectively. FIG. 25 is cross-sectional views illustrating the method for producing the semiconductor device according to the present embodiment.

Figure 22:
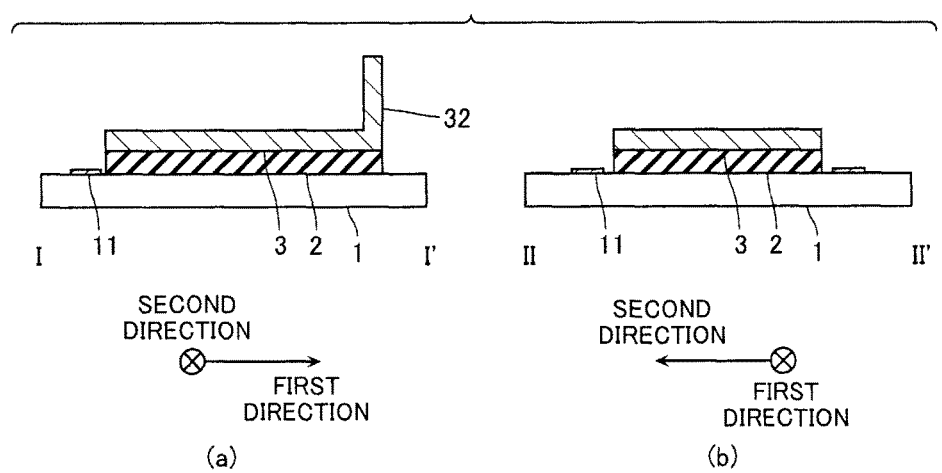
FIG. 22 is side views schematically illustrating a method for producing the semiconductor device.
Figure 23:
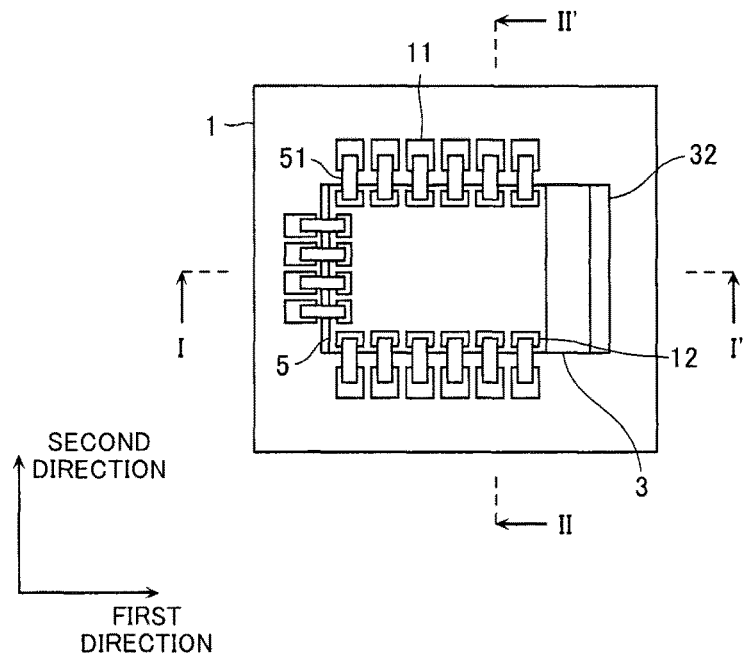
FIG. 23 is a plan view schematically illustrating a method for producing the semiconductor device.

In the method for producing the semiconductor device according to the present embodiment, first the substrate 1 on which wires (not illustrated) and the contact portions 11 are provided is prepared as illustrated in FIGS. 21 and 22. The substrate 1 is almost the same as the substrate 1 according to first embodiment, but is different from the substrate 1 according to first embodiment in that the contact portions 11 are also provided in a portion exposed from the lower shield plate 3 in the first direction. The lower shield plate 3 is placed in a space surrounded on three sides by the contact portions 11 of the substrate 1 and is then adhered by using a first adhesive 2 as in first embodiment.

Figure 24:
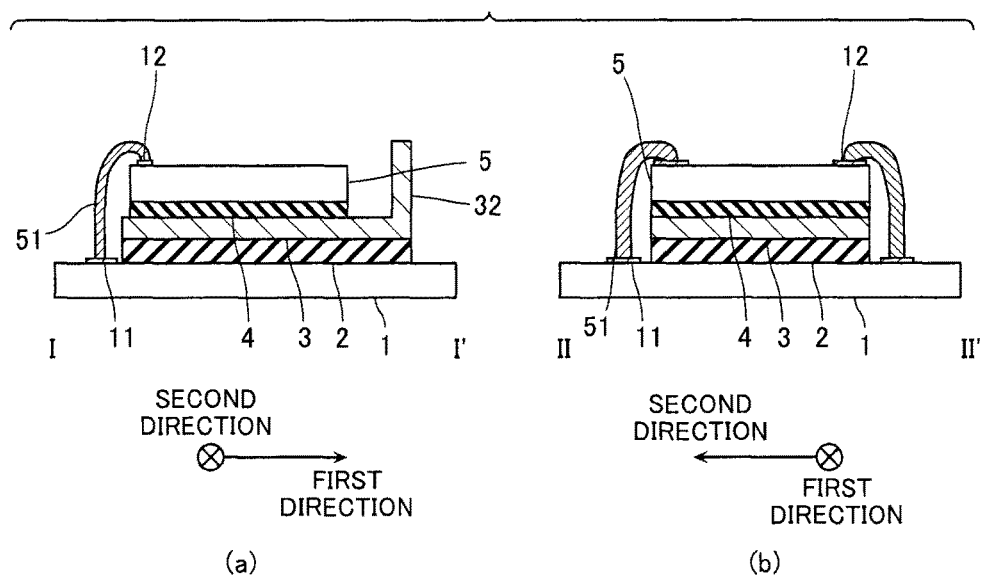
FIG. 24 is side views schematically illustrating a method for producing the semiconductor device.

Next, as illustrated in FIGS. 23 and 24, the semiconductor chip 5 is mounted on the lower shield plate 3. The semiconductor chip 5 is placed on the lower shield plate 3 so that contact portions 12 provided on the upper surface of the semiconductor chip 5 correspond to the contact portions 11 provided on the substrate 1. The semiconductor chip 5 according to the present embodiment is produced in almost the same manner as the semiconductor chip 5 according to first embodiment, but is different from the semiconductor chip 5 according to first embodiment in that the contact portions 12 are also formed in a portion of the upper surface that is in the vicinity of the exposed portion. Next, the contact portions 12 of the semiconductor chip 5 and the contact portions 11 of the substrate 1 are electrically connected to each other via the bonding wires 51.

Figure 27:
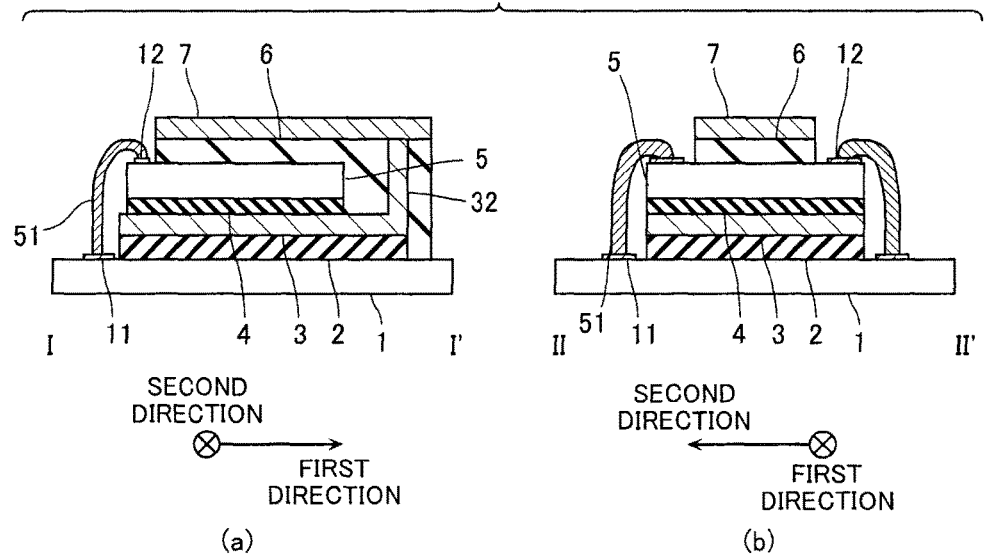
FIG. 27 is side views schematically illustrating a method for producing the semiconductor device.

Next, as illustrated in FIG. 25, a first insulating resin 6 is formed on one surface of the upper shield plate 7 as in first embodiment. Next, as illustrated in FIGS. 26 and 27, the upper shield plate 7 is pressed against the semiconductor device 5, and the lower shield plate 3 and the upper shield plate 7 are made in contact with each other via a side wall portion 32 extending from the lower shield plate 3 to the upper shield plate 7 as in first embodiment. In this step, the upper shield plate 7 is placed in a space surrounded on three sides by the contact portions 12 on the upper surface of the semiconductor chip 5.

Figure 20:
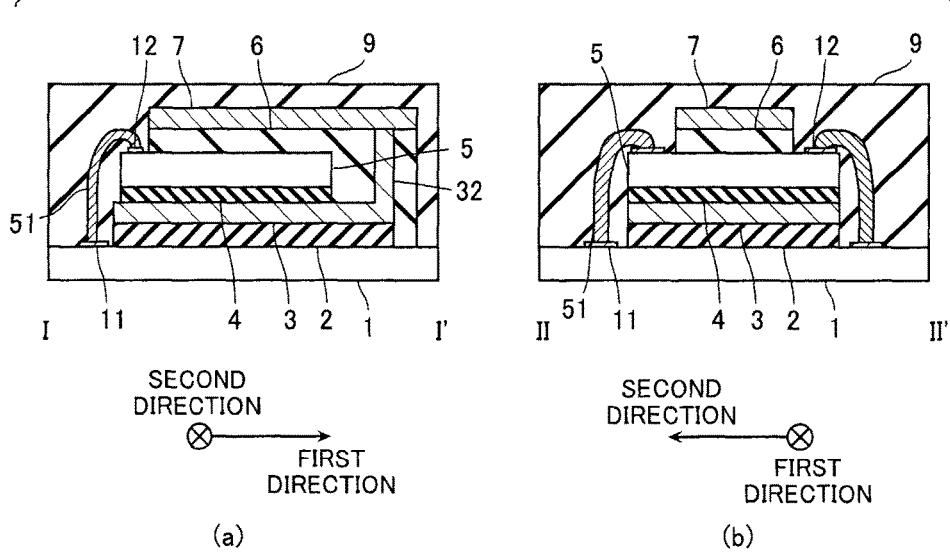
FIG. 20 is side views schematically illustrating the semiconductor device.

Next, the first insulating resin 6 is cured by heat or the like, and all the members are embedded in a second insulating resin 9 as in first embodiment. As a result of the above steps, the semiconductor device according to the present embodiment is produced as illustrated in FIGS. 19 and 20.

Semiconductor Storage Device According to Another Embodiment

Figure 28:
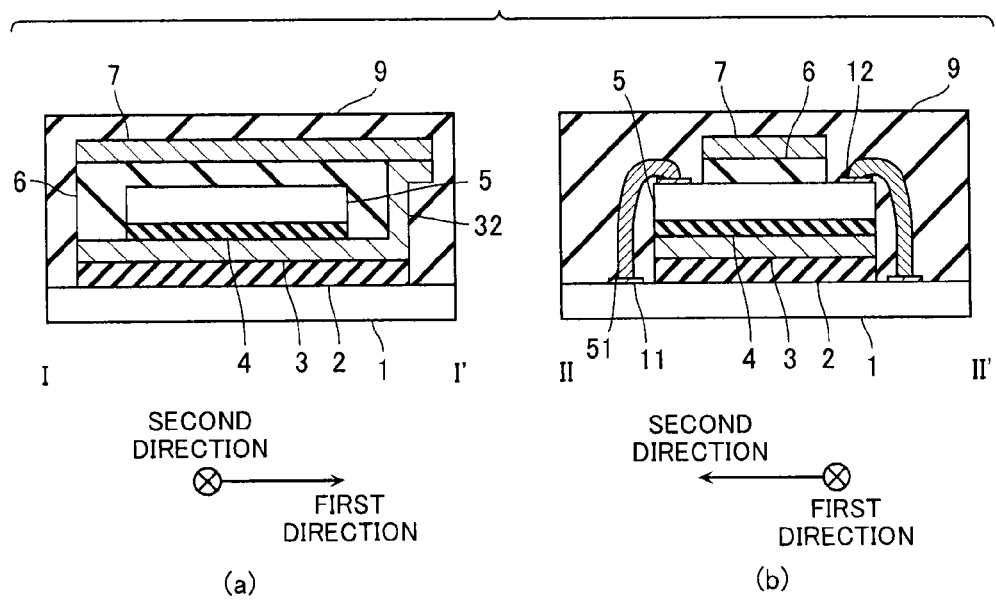
FIG. 28 is side views schematically illustrating a semiconductor device according to another embodiment.

In each of the above embodiments, an upper end of the side wall portion 32 is substantially perpendicular to the upper shield plate 7. However, for example, the upper end of the side wall portion 32 may be formed so as to form a surface substantially parallel with the upper shield plate 7 as illustrated in FIG. 28. Such a configuration can be easily accomplished just by bending a plate made of a magnetic substance when forming the lower shield plate 3. According to such a configuration, it is possible to increase a contact area between the lower shield plate 3 and the upper shield plate 7, thereby reducing magnetic resistance on a contact surface and increasing shield performance.

Some embodiments of the present invention have been described above, but these embodiments are presented as examples and do not limit the scope of the present invention. These embodiments can be carried out in other various forms, and various kinds of omission, substitution, change can be made without departing from the scope of the invention. These embodiments and modifications thereof are included in the scope of the invention and included in the scope of the invention described in the claims and equivalents thereof.

REFERENCE SIGNS LIST

1 . . . substrate, 2 . . . first adhesive, 3 . . . lower shieldplate, 4 . . . second adhesive, 5 . . . semiconductor device, 6 . . . first insulating resin, 7 . . . upper shieldplate, 9 . . . second insulating resin, 11, 12 . . . contact portions, 32 . . . side wall portion

The invention claimed is:

1. A semiconductor device comprising:
a substrate on which a first contact portion is formed, the substrate extending in a first direction and a second direction crossing the first direction;
a lower shield plate that is provided above the substrate so as to avoid the first contact portion and includes a magnetic substance;
a semiconductor chip that is provided above the lower shield plate and has a second contact portion electrically connected to the first contact portion;
a connection member that electrically connects the first contact portion and the second contact portion;
an insulating resin that covers an upper surface and two side surfaces in the first direction of the semiconductor chip; and
an upper shield plate that is provided above the insulating resin so as to avoid the second contact portion and the connection member and includes a magnetic substance,
the lower shield plate having two ends on either side of the semiconductor chip in the first direction,
the two ends of the lower shield plate being bent toward the upper shield plate so as to form two side wall portions whose tips are connected to the upper shield plate, and
the side wall portions extending in the second direction and continuously covering a side surface in the first direction of the semiconductor chip via the insulating resin.

2. The semiconductor device according to claim 1, wherein at least one of the side wall portions faces at least one of the side surfaces of the semiconductor chip on which the connection member is not disposed.

3. A method for producing a semiconductor device, comprising:
providing, above a substrate on which a first contact portion is formed, a lower shield plate including a magnetic substance so that the lower shield plate avoids the first contact portion, the substrate extending in a first direction and a second direction crossing the first direction;
placing, above the lower shield plate, a semiconductor chip having a second contact portion electrically connected to the first contact portion so that the first contact portion and the second contact portion correspond to each other;
electrically connecting the first contact portion and the second contact portion by using a connection member; and
pressing, against the semiconductor chip, an upper shield plate that includes a magnetic substance and that has, on a rear surface thereof, a plastic insulating layer having a predetermined thickness so that the rear surface faces the semiconductor chip and so that the upper shield plate avoids the second contact portion and the connection member and making the lower shield plate and the upper shield plate in contact with each other via a side wall portion extending from an end in the first direction of at least one of the lower shield plate and the upper shield plate to the other one of the lower shield plate and the upper shield plate.

4. The method according to claim 3, wherein the lower shield plate and the upper shield plate have two side wall portions.

5. The method according to claim 3, wherein the lower shield plate has the side wall portion(s).

6. The method according to claim 4, wherein the lower shield plate has the side wall portion(s).

7. The semiconductor device according to claim 1, wherein a width in the second direction of the upper shield plate is smaller than a with in the second direction of the semiconductor chip.

8. The semiconductor device according to claim 1, wherein a width in the second direction of the upper shield plate is smaller than a with in the second direction of the lower shield plate.

9. The semiconductor device according to claim 1, wherein the lower shield plate includes PC permalloy, a magnetic alloy containing iron other than the PC permalloy or a high-magnetic-permeability material other than the magnetic alloy containing iron.

10. The semiconductor device according to claim 1, wherein the side wall portions extend in a third direction in which the substrate, the lower shield plate, the semiconductor chip and the upper shield plate are stacked and continuously cover the side surfaces in the first direction of the semiconductor chip.

11. The method according to claim 3, wherein the side wall portion extends in the second direction and continuously covers a side surface in the first direction of the semiconductor chip.

12. The method according to claim 3, wherein a width in the second direction of the upper shield plate is smaller than a with in the second direction of the semiconductor chip.

13. The method according to claim 3, wherein a width in the second direction of the upper shield plate is smaller than a with in the second direction of the lower shield plate.

14. The method according to claim 3, wherein the lower shield plate includes PC permalloy, a magnetic alloy containing iron other than the PC permalloy or a high-magnetic-permeability material other than the magnetic alloy containing iron.

15. The method according to claim 11, wherein the side wall portion extends in a third direction in which the substrate, the lower shield plate, the semiconductor chip and the upper shield plate are stacked and continuously covers the side surface in the first direction of the semiconductor chip.

16. The method according to claim 3, wherein the upper shield plate is pressed against the semiconductor chip so that the plastic insulating layer covers an upper surface and two side surfaces in the first direction of the semiconductor chip.

17. The method according to claim 3, wherein
the lower shield plate has two ends in the first direction, the two ends of the lower shield plate being bent toward the upper shield plate so as to form two side wall portions,
the semiconductor chip is placed above the lower shield plate between the two side wall portions, and
the upper shield plate is pressed against the semiconductor chip so as to make the lower shield plate and the upper shield plate in contact with each other via the two side wall portions.

* * * * *